United States Patent [19]
Vojir et al.

[11] Patent Number: 4,816,805
[45] Date of Patent: Mar. 28, 1989

[54] RESIDUE NUMBER SYSTEM SHIFT ACCUMULATOR DECODER

[75] Inventors: William M. Vojir, Seaford; Joel R. Davidson, Baldwin, both of N.Y.

[73] Assignee: Grumman Aerospace Corporation, Bethpage, N.Y.

[21] Appl. No.: 9,725

[22] Filed: Feb. 2, 1987

[51] Int. Cl.[4] ............................................. H03M 7/00
[52] U.S. Cl. ...................................... 341/83; 364/746; 364/724.01
[58] Field of Search ............... 340/347 D D; 364/724, 364/746

[56] References Cited

U.S. PATENT DOCUMENTS

| | | | |
|---|---|---|---|
| 4,041,284 | 8/1977 | Bond | 235/150.5 |
| 4,064,400 | 12/1977 | Akushsky et al. | 364/746 |
| 4,107,783 | 8/1978 | Huang | 364/746 |
| 4,121,298 | 10/1978 | Akushsky et al. | 364/746 |
| 4,187,549 | 2/1980 | Bond et al. | 364/746 |
| 4,281,391 | 7/1981 | Huang | 364/746 |
| 4,458,327 | 7/1984 | McCoskey | 364/746 |
| 4,506,340 | 3/1985 | Circello et al. | 364/746 |

OTHER PUBLICATIONS

Jenkins, W. and Leon, B., "The Use of Residue Number Systems in the Design of Finite Impulse Response Digital Filters", pp. 196-197 (1977).
Szabo, N. and Tanaka, R., *Residue Arithmetic and its Applications to Computer Technology*, chapters 1 and 2 attached, pp. 27-32 (1967).
Taylor, F., "Large Moduli Multipliers for Signal Processors", (1981).
Vojir, W. "Hardware Design for New Digital Signal Processing Techniques", (1980).

*Primary Examiner*—William M. Shoop, Jr.
*Assistant Examiner*—Richard K. Blum
*Attorney, Agent, or Firm*—Morgan & Finnegan

[57] ABSTRACT

Signal processing techniques are disclosed for applications such as finite impulse response filtering. After initial processing in residue number system (RNS) channels, the signals are converted from residue form to a true external representation of the filter output. The conversion employs a chinese remainder theorem decoder and shift accumulator controlled to utilize adaptive modulo reduction. As a consequence, each modulus function value is reduced during computation when it exceeds the modulus and not at the end of the function evaluation. This reduces hardware requirements by minimizing the arithmetic word length. In implementing the technique, each function value is tested to see if it is within a modulus range and the corresponding modulus value is subtracted if it is not. This is done as many times as is necessary to bring each function value within the range. By utilizing this technique, speed and computational accuracy are improved in filter processes thereby producing improved performance in radar, seismic, acoustic and other applications which depend on such filter characteristics.

14 Claims, 3 Drawing Sheets

RESIDUE NUMBER SYSTEM SHIFT ACCUMULATOR DECODER

INTRODUCTION

The invention relates to methods and equipment for decoding the output of residue number system (RNS) signal processors used in digital filter processes and the like.

BACKGROUND AND PRIOR ART

In the design of digital filters of large order N having demanding computational speed, range and other requirements, the use of transform methods, e.g., FFT has a number of drawbacks.

It has been proposed to overcome these shortcomings by use of residue number system (RNS) techniques.

Use of the residue number system in signal processors permits parallel processing using multi-channel, short word length circuit configurations. An RNS signal processor transforms numbers from binary or decimal form into residue form which represents the number by a distinct set of smaller residue values. Once the value is in residue form, the signal processor is able to perform certain arithmetical operations using the so-called system of residue class arithmetic.

Residue class arithmetic is a modulo form of calculation. Here any value must be within a modulus range from zero through the modulus. The system is periodic: any value outside the modulus range is transformed to a corresponding value within the modulus range. This corresponding value is the integer difference between the numeric value and the greatest multiple of the modulus less than the numeric value.

To convert a decimal number N to its modulus value, a division is performed with the decimal number, N, being the divident and the modulus, $p_i$, or multiples thereof less than N, being the divisor. The remainer, $r_i$, of this division is the modulus representation called the residue. The relationship is sometimes expressed as:

$$N = r_i \mod e_i \qquad (1)$$

Thus where the modulus, $P_i$, is 7 and the numeric value, N, is 10 its modulus value or residue, $r_i$, is $10-7=3$. If the numeric value is 16 its residue value is $16-(2\cdot 7)=2$.

Residue number systems of interest herein use moduli from a restricted moduli set made up of pairwise relatively prime integers. Relatively prime or mutually prime numbers as used herein refer to moduli which have no common divisor greater than 1 even though each individual modulus may be divisible by other than one and the number itself. Using this restricted class any integer N can be uniquely coded in a residue number system as a sequence of residue digits $[r_1, r_2, \ldots, r_L]$ where the moduli are relatively prime.

The range of the system is from 0 tW-1 where W is the product of the moduli. If negative numbers are to be represented, the range is $-W/2$ to $(W/2)-1$ when W is even.

In moduli form the number N is sometimes represented as N $(P_1, P_2, P_3, \ldots, P_L)$ where $P_1, P_2, P_3, \ldots, P_L$ are the co-prime moduli. Where, for example, N is an operand equal to 18 and the moduli set is 7, 15, 17 then the residues are 4, 3 and 1 and this set of residue values [4, 3, 1] uniquely represents the operand value 18. The range W-1 of this moduli system is $(7.15.17)-1=1784$.

These residues are dependent only upon their corresponding modulus and not upon each other. In this way each residue can be operated on independently of the others. Further, there are no burrows or carries and the word lengths of these residues are much shorter than the decimal or digital word lengths, thereby allowing faster operations with less hardware. The limited number of solutions within each channel permits their storage in ROMS for fast access. The signal processor operates on each of the residue values independently using the periodic modulo arithmetic. Although some RNS operations are relatively cumbersome, those involving multiplication and addition can be relatively fast and are therefore attractive in digital filter designs such as FIR types which are implemented with multiplication and addition.

After the signal processor has finished executing all of the periodic residue operations on each of the individual inputted residue values, a decoding method must then be implemented to convert the processed residue values into the true external representation of the output. This is often a cumbersome process involving significant computational overhead.

Decoding residue numbers is frequently based upon an implementation of the chinese remainder theorem (CRT). This theorem takes each individual residue and multiples it by a distinct coefficient corresponding to the individual modulus. These products are then all summed together. The summation is then reduced using modulo reduction. The chinese remainder theorem can be expressed as:

$$N_{out} = (C_1 r_1 + C_2 r_2 \ldots + C_L r_L) \, Mod \, M \qquad (2)$$

$$N_{out} = \sum_{i=0}^{L} (C_i r_i) \, Mod \, M \qquad (3)$$

where $N_{out}$ is the true external representation of the processed value, $C_i$ is the individual CRT coefficient and M is the product of all the moduli, $P_i$. The CRT coefficient, $C_i$, can be obtained through the relationship, $$C_i = i(M/P_i) = 1 \, Mod(P_i) \text{ where } 0 < b_i < P_i. \qquad (4)$$

By finding all of the CRT coefficients and utilizing them in the CRT summation, $N_{out}$ may be obtained. This final output is the true external representation of the processed signal.

To implement the chinese remainder theorem in digital processing, a separate equivalent form of the CRT is used such that $$N_{out} = \left[ \sum_{k=0}^{S-1} f(k) 2^{s-k-l} \right] Mod \, M \qquad (5)$$

where s is the number of moduli to be decoded and k is the CRT value address.

This form is then reduced using Horner's rule to yield a recursive expression of the form $$N_{out} = (f(s-1) + 2(f)(s-2) + \ldots 2(f(1) + 2(f(0)) \ldots \\ Mod \, M. \qquad (6)$$

This is the final function that represents the implemented algorithm.

In order to increase system speed the function values, (f(k) can each be multiplied prior to decoding and stored in memory. These values can be accessed during decoding because they are uniquely determined by the address, k.

While residue processor decoders have been proposed for various signal processing applications, they are incapable of meeting the needs of some systems having stringent throughput, accuracy and range requirements.

It is accordingly an object of the invention to provide RNS signal decoding techniques which are capable of real time operation in applications requiring high accuracy and speed.

Another object is to provide such techniques which are capable of wide dynamic range utilizing a relatively small number of channels.

A further object of the invention is the provision of filter techniques which are flexible with respect to the number of moduli utilized and their values.

A still further object is to provide filtering techniques which are hardware transparent. Various families of components may be used in implementing the functional elements of the circuit.

BRIEF SUMMARY OF THE INVENTION

To achieve the foregoing objectives, the invention utilizes an RNS decoder system which comprises;

(a) means for individually accessing each of a plurality of output channels of a residue number system signal processor containing a plurality of residue values;

(b) means for selecting from those values a chinese remainder theorem (CRT) function value;

(c) means for summing said function value with a previously summed value;

(d) means for multiplying the new summed value by 2;

(e) means for testing the resultant product to see if it is outside a predetermined range dependent on the decoded moduli;

(f) means for reducing said product by the value of the modulus if it is outside said range;

(g) means for repeating steps (e) and (f) as needed to bring said modulus within said range;

(h) means causing the summed value to be outputted;

(i) means for repeating steps (a) through (h) as required until the decoding is complete.

In the preferred embodiment illustrated in the drawing and discussed in further detail below, the various residue values are processed in a plurality of channels of the signal processor. The channel outputs are each applied to an individual look-up table. These look-up tables then output a corresponding address value which corresponds in turn to a particular Chinese remainder theorem function coefficient.

The CRT coefficients are each in turn applied to a residue number system shift accumulator system. In the RNS shift accumulator the CRT function vlaue is summed with previously computed CRT function values held in the accumulator and shifted once to multiply by two. After this occurs, the resultant is subjected to adaptive modulo reduction. The resultant is compared with a value DMR which corresponds to the product of the decoded moduli minus one. This comparison test whether the new value is within the DMR range. If it is not within the modulus range a negative of the corresponding modulus number is then added to the new value as many times as is necessary to bring it within the range.

Once the value is brought within the modulus range the system checks to see if any other channel outputs have not been accessed. If there are such channels, the system proceeds to the next accessable one and repeats the decoding method, operating on the value from the previous decoding cycle. If there are no further channel outputs to be accessed, the system outputs the final value from the last decoding cycle. This is the final output and the true external representative of the signal processor output.

Another channel, by representing the modulus $2^b$ where b is the number of bits, requires no encoding hardware and supplies the least b significant bits without decoding.

By utilizing adaptive modulo reduction the invention decreases the function value during its computation only when it exceeds the modulus rather than at the end of the function evaluation. This reduces hardware requirements by minimizing the arithmetic word length and thereby increases speed. Conversion speed can also be changed by appropriate selection of component type.

Other objects and functions of the invention will be evident from the following detailed description.

DETAILED DESCRIPTION OF THE DRAWING

Figure 1:
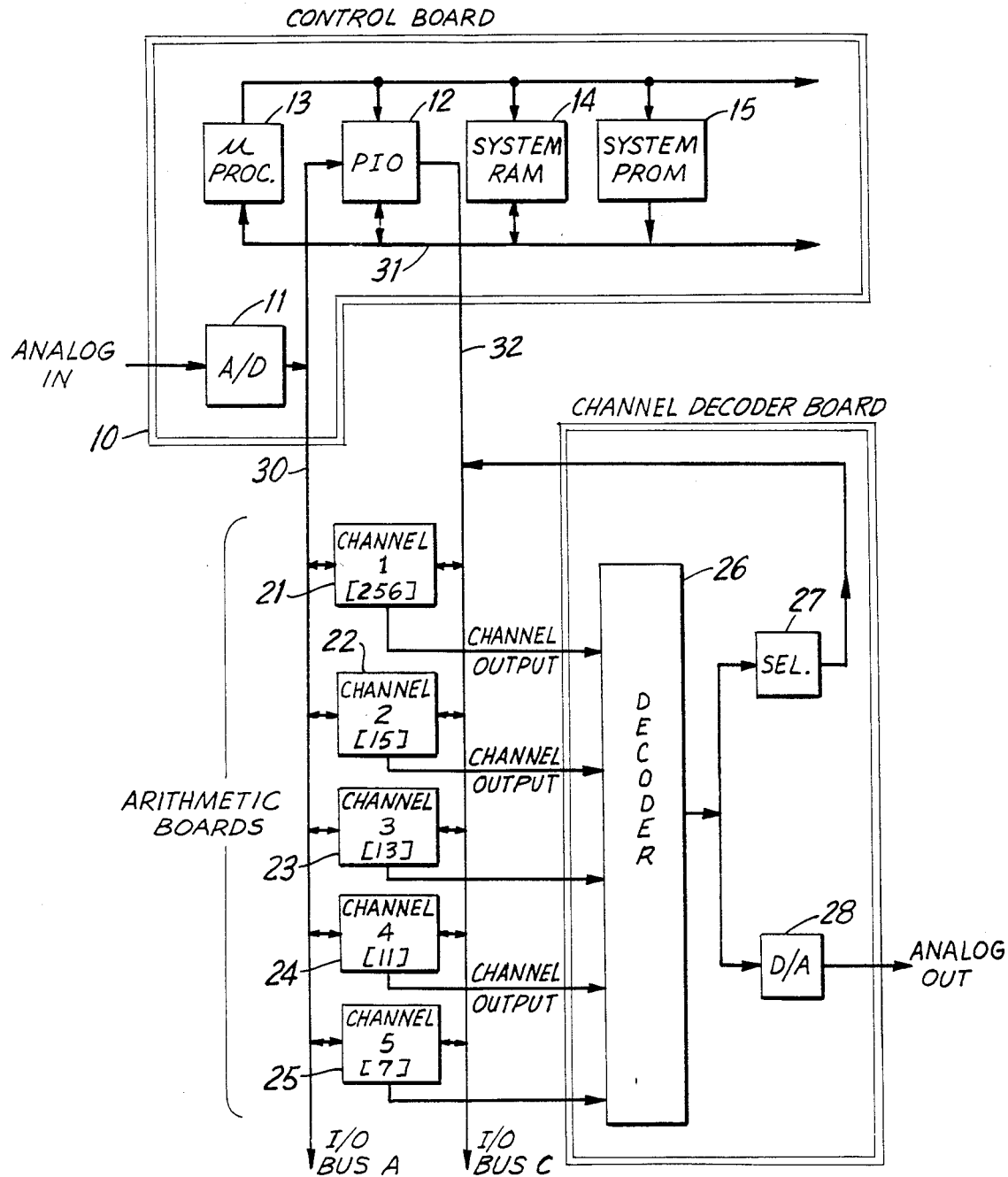
FIG. 1 is a schematic block diagram which illustrates a processor incorporating the invention.

An overview of the environment of the invention is provided in FIG. 1. The system as illustrated therein includes a control unit 10 which receives the analog input signal ANALOG IN and converts it to digital form employing an A-to-D converter 11. The digitally encoded signal which appears on input/output bus 30 is then supplied to the control unit data bus 31 via the input/output interface unit 12. The interface unit 12 also connects with another bus 32 which connects with the decoding section as described hereinafter.

The control unit 10 includes a microprocessor 13 together with system RAM 14 and system PROM 15. The latter incorporates the filter coefficient data and program control data as well.

The digitized input signal appearing on bus 30 is supplied to RNS processor channels 1 to 5 in respective circuits 21 to 25. Circuit 21 incorporates processor channel 1 representing modulus 256 and receives coefficient data from system PROM 15 via bus 32. The output is applied to decoder system 26 as illustrated. Circuit 22 incorporates channel 2 performing modulus 15 arithmetic while a circuit 23 embodies channel 3 and performs modulus 13 arithmetic. Similar circuits 24 and 25 incorporate channels 4 and 5 and perform moduli 11 and 7 arithmetic, respectively. The outputs of these channels are also supplied to the decoder 26. The channels 2-5 receive coefficient data via bus 32 and perform the RNS arithmetic operations required by the particular processor application. Typically, this would involve RNS multiplication of the input data samples by the filter coefficient together with SHIFT and accumulation operations.

The decoder 26 receives the modulus channel outputs and decodes them to provide the solution in digital form. After conversion by digital to analog converter 28, the results of the process are provided in analog form as the ANALOG OUT signal. Selector 27 functions to supply the result in digital form where needed.

Figure 2:
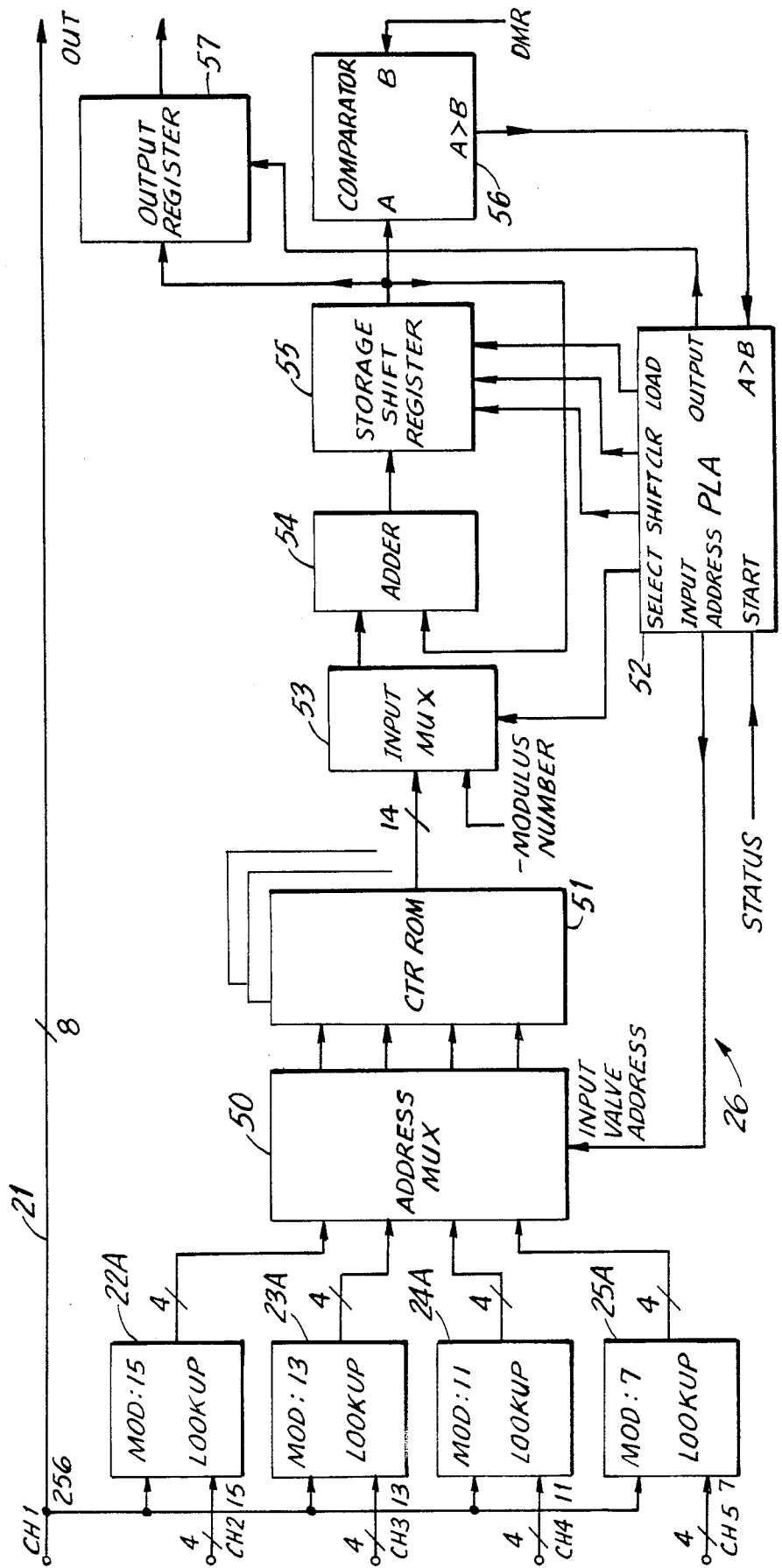
FIG. 2 illustrates, in block diagram, a preferred embodiment of the invention.

As illustrated in FIG. 2, the outputs of the channels 2-5 are applied to decoder 26 at respective look-up tables 22A, 23A, 24A and 25A which contain precomputed results of functions related to the differences between the binary channel 1 output (modulus 256) and each of the other channels.

An address multiplexer 50 multiplexes the look-up table outputs, applying them selectively to a CRT ROM 51 under control of an INPUT VALUE ADDR signal derived from a programmable logic array (PLA) 52.

The address MUX 50 acts to transpose rows and columns of the CRT ROM. These memory locations store coefficients of the chinese remainder theorem (CRT) function, e.g. the values $f(s-1), f(s-2..., f(0)$ previously referred to in equation 6.

The output of the ROM 51 is applied to the RNS shift accumulator which includes an input multiplexer 53, adder 54, storage shift register 55, comparator 56, output latch 57, and the programmable logic array (PLA) 52.

The PLA 52 contains the control logic for the shift accumulator, instructing the functional elements in each step of the decoding process. Thus, at each step of the decoding program, the PLA controls the address multiplexer 50 to address the CRT ROM 51. A single coefficient is then outputted to the input multiplexer 53.

Input multiplexer 53 selects either this CRT coefficient or the negative of the corresponding modulus value. This selection, explained hereinafter, is based upon a control system signal SELECT from the PLA.

The output of the multiplexer 53 is supplied as one of the inputs to adder 54 which adds to it a sum that has been previously computed and stored in the storage shift register 55.

After the new sum is stored in the register 55, it is shifted left causing a binary multiplication of the stored sum by two.

The resultant "A" is then compared in comparator 55 with the decoded moduli range, DMR, which in the illustrated system is $(\cdot11\cdot13\cdot15)-1=15014$, to see if the value A is greater than the DMR value. If it is, that condition is signified by input A>B to PLA 52. This causes the PLA to set the state of the SELECT signal, causing the input multiplexer 53 to select the negative of the modulus numberand to apply it to the adder 54. This results in a corresponding reduction in the value "A".

The output of the adder is once again stored in the shift register 55, but this tie it is not shifted. The stored value is once again compared to the DMR value to see if it is outside the range. If it is, the corresponding negative modulus valve is once again added to the previously stored sum causing it again to be decremented by the modulus value. This routine continues until a value not greater than DMR is achieved.

This system is an implementation of the previously described adaptive modulo reduction (AMR) which reduces a function value during its computation only when it exceeds the modulus, rather than at the end of the function evaluation.

Once the stored value is within the modulus range, the programmable array logic then determine if the decoder has processed all of the addresses in the CRT ROM 50, and hence all of the channel outputs. If the system has not, the address value is decremented and the decoder steps are repeated. If the system has processed all of the addresses, a signal "OUTPUT" is sent by the PLA to the output register 56 enabling it to read in the value stored in the shift register 55. This value combined with the channel 1 output is the final output and the PLA now stops the decoder process.

Chips found suitable for demonstrating the utility of the system include four 74LS157s to implement input MUX 53, four 74LS283s to configure adder 54, a set of four PLA 16R4s to form shift register 55, four 74LS85s to form comparator 55, two PLA 16R4s for the PLA 52 and two 74LS374s for implementing output register 56.

Figure 3:
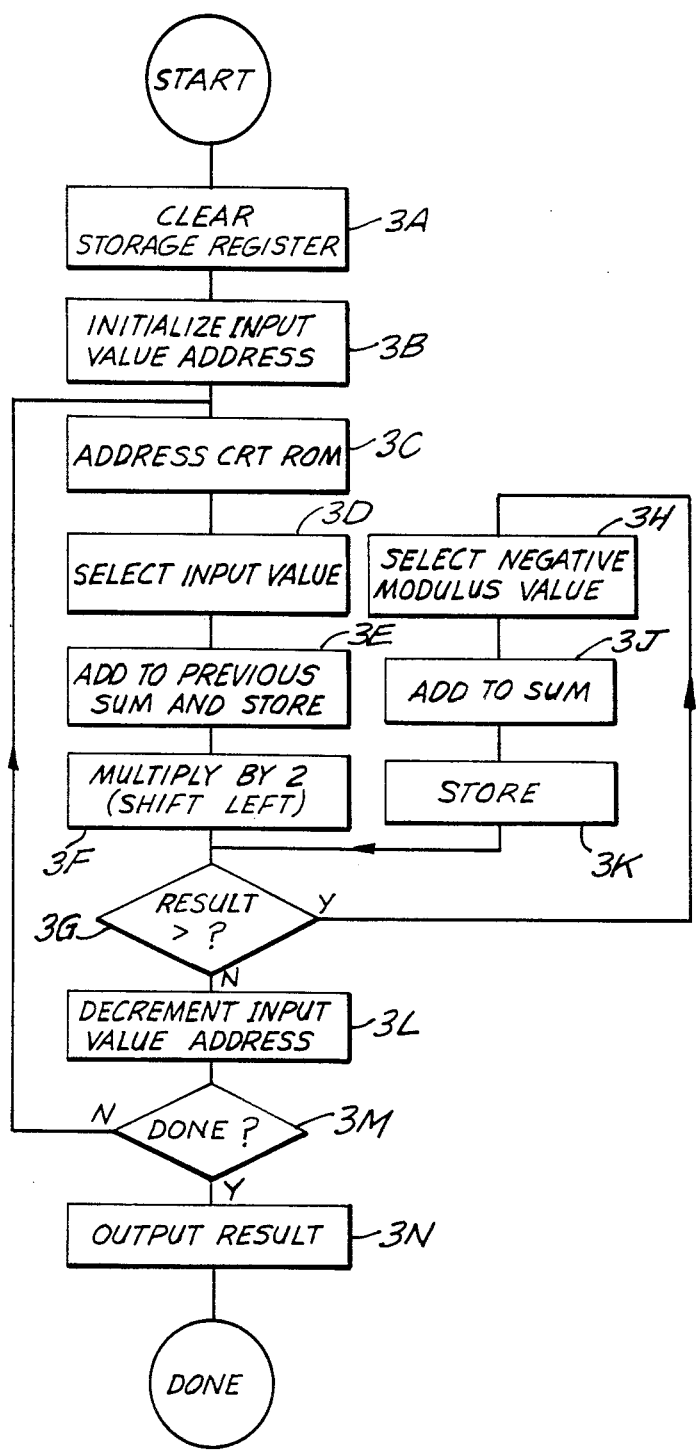
FIG. 3 is a data flow diagram of the implemented algorithm

An illustration of the implementing algorithm is provided in FIG. 3. The process begins with a clearing of the storage register 55 (step 3A) and an initialization of the CRT ROM input value address via the address multiplexer 50 (step 3B). As a consequence, an initial address of ROM 51 is specified leading to the selection of an input value which is applied to the input MUX 53 (steps 3C, 3D).

As further illustrated in FIG. 3, any previously stored sum in shift register 55 is added to the value in adder 54 (via the feedback path in FIG. 2). See step 3E. The sum, appearing as the output of 54, is applied to the shift register 55 where a shift left is performed to multiply the sum by a factor of two (step 3F).

As shown by the decision step 3G in FIG. 3, the result is tested to determine if it is greater than the modulus value minus 1. If it is, then the negative of the modulus value is selected with the aid of the SELECT signal from the PAL 52 (step 3H). That negative value is added to the sum and stored in the register 55 (steps 3J, 3K). The comparison is then repeated (step 3G). If the result is greater than the modulus minus 1, than the subroutine is repeated otherwise the process proceeds to the next step 3L where the PAL 52 causes the input address of the ROM to be decremented.

If all of the ROM values have been accessed, the process is completed and the output is registered (steps 3M, 3N) otherwise the procedure beginning with step 3C is repeated.

What is claimed is:

1. A residue number system (RNS) decoder system for decoding the outputs of a plurality of parallel RNS channels at least some of which include means based on different relatively prime moduli for performing modular arithmetic, which comprises:

(a) means for storing a set of chinese remainder theorem (CRT) function values in a set of addressable locations;
(b) means responsive to said outputs for deriving corresponding addresses of said CRT values in said storage means;
(c) means for selecting one of said addresses;
(d) means for deriving the function value at said address;
(e) means for summing said function value with any previously summed value;
(f) means for multiplying the new summed value by 2;
(g) means for testing the resultant product to see if it is outside a predetermined range dependent on the decoded moduli;
(h) means for reducing said product by the value of the modulus if it is otherwise outside said range;
(i) means for repeating steps (g) and (h) as needed to bring said modulus within said range;

(j) means causing the summed value to be outputted;

(k) means for repeating steps (c) through (k) as required until the decoding is complete.

2. The decoder system of claim 1 including a logic array for controlling said means for selecting, said means for summing, said means for multiplying and said means for testing the resultant product.

3. A system according to claim 1 in which said means for multiplying comprises a storage shift register and said means for testing comprises a comparator having one input supplied by the output of said storage shift register and another input related to the operative modulus value.

4. A system according to claim 1 in which said means for storing includes a ROM for storing coefficients related to the chinese remainder theorem and said means for selecting comprises a multiplexer circuit responsive to said outputs for addressing said ROM.

5. A system according to claim 3 including a logic array connected to respond to the output of said comparator and having means for controlling said reducing means.

6. A system according to claim 4 including logic circuits for controlling the addressing of said CRT ROM.

7. A digital signal processing method for decoding numbers in residue form comprising the steps of:

(a) writing into memory having a plurality of addressable memory locations a chinese remainder theorem (CRT) function value of a form $$f(j) = G(b_{Lj}, \ldots, b_{1j}) = m_i b_j$$

wherein $m_i$ is the product of all moduli in a moduli set divided by an $i^{TH}$ modulus and $b_{ij}$ is the $i^{TH}$ bit in a binary bit pattern at a $j^{TH}$ address of each addressable memory location;

(b) sequentially accessing said addresses to select said values;

(c) summing the selected value with the result of any previously processed value;

(d) multiplying the resultant by 2 and storing the product;

(e) testing the product value for inclusion within the operative modulus range;

(f) reducing said product value as required to bring the product within range.

8. The method of claim 7 in which the number of bits in the bit pattern is at least $s+1$ wherein s is the lowest order binary digit capable of representing the largest value modulus in the moduli set.

9. The method of claim 7 in which the step of reducing said product is multiplexed with the steps accessing said addresses.

10. The method of claim 7 in which the step of testing is accomplished by comparing said product value with a value related to the modulus value.

11. An apparatus for translating to true external form residue value outputs of a signal processor, said apparatus comprising a residue number system shift accumulator (RNSSA) connected to receive said outputs for implementing a chinese remainder theorem (CRT) decoding method using adaptive modulo reduction, said RNSSA including:

(a) control logic means for implementing control logic throughout the RNSSA;

(b) means for storing CRT decoding function values;

(c) means for deriving addresses for said stored values as a function of said outputs;

(d) selecting means for sequentially addressing and reading out said stored function values;

(e) means for subjecting said selected value to arithmetic operations and for storing the resultant value;

(f) testing means for determining if said resultant value is greater than a predetermined range related to the decoded moduli;

(g) means for reducing said resultant value if it does exceed said range to bring it within the said range;

(h) means for repeating steps (c) through (g) for other of said outputs.

12. A system as defined in claim 11 in which said reducing means decrements said value by one or more steps each equal to the modulus as required to achieve a value within said range.

13. A system as defined in claim 11 further comprising multiplexing means responsive to said logic means for controlling access to said addressable memory locations.

14. A system as defined in claim 11, wherein said translating apparatus is implemented to decode the residue value output of a residue number system (RNS) finite impulse response (FIR) filter output.

* * * * *